(12) United States Patent
Newlin

(10) Patent No.: US 11,652,411 B2
(45) Date of Patent: May 16, 2023

(54) SYSTEM AND METHOD OF MAINTAINING CHARGE ON BOOT CAPACITOR OF A POWER CONVERTER

(71) Applicant: NXP USA, Inc., Austin, TX (US)

(72) Inventor: Trevor M. Newlin, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 6 days.

(21) Appl. No.: 17/186,889

(22) Filed: Feb. 26, 2021

(65) Prior Publication Data
US 2022/0278614 A1 Sep. 1, 2022

(51) Int. Cl.
*H02M 3/156* (2006.01)
*H02M 1/08* (2006.01)
*H02M 1/00* (2006.01)

(52) U.S. Cl.
CPC ......... *H02M 3/156* (2013.01); *H02M 1/0032* (2021.05); *H02M 1/08* (2013.01)

(58) Field of Classification Search
None
See application file for complete search history.

(56) References Cited

U.S. PATENT DOCUMENTS

| | | | | |
|---|---|---|---|---|
| 6,529,034 B1* | 3/2003 | Ranjan | ................. | H01L 29/782 326/118 |
| 7,026,801 B2* | 4/2006 | Fowler | ................. | H03K 17/063 323/288 |
| 7,321,258 B2* | 1/2008 | Wong | ................. | H02M 3/1588 323/288 |
| 8,593,211 B2* | 11/2013 | Forghani-Zadeh | ................. | H03K 17/08122 327/108 |
| 9,350,241 B2* | 5/2016 | Chang | ................. | H02M 3/1588 |
| 9,973,087 B1* | 5/2018 | Lin | ................. | H02M 1/096 |
| 10,992,295 B2* | 4/2021 | Braun | ................. | H03K 5/24 |

FOREIGN PATENT DOCUMENTS

JP 2018133916 A * 8/2018

OTHER PUBLICATIONS

NXP; "Three-Phase Field Effect Transistor Pre-Driver, Rev. 2.0"; retrieved from the internet https://www.nxp.com/docs/en/data-sheet/MC33927.pdf on Aug. 17, 2022; 44 pages.

* cited by examiner

*Primary Examiner* — Jeffrey A Gblende

(57) ABSTRACT

A boot charge circuit for charging a boot capacitor of a switching power converter with upper and lower switches including pulse circuitry that provides a boot refresh pulse in response to a pulse control signal transitioning to an active state to turn on the lower switch for a duration of the boot refresh pulse, and gate circuitry that prevents activation of the upper switch until after completion of the boot refresh pulse in response to the transitioning of the pulse control signal. The boot refresh pulse has a negligible duration relative to each switching cycle yet sufficient to charge the boot capacitor to enable a driver to turn on the upper switch. A load monitor may be included to disable the pulse circuitry from providing the boot refresh pulse during higher load levels.

20 Claims, 3 Drawing Sheets

SYSTEM AND METHOD OF MAINTAINING CHARGE ON BOOT CAPACITOR OF A POWER CONVERTER

BACKGROUND

Field of the Invention

The present invention relates in general to power converters, and more particularly to a system and method of maintaining charge on a boot capacitor of a DC-DC switching power converter.

Description of the Related Art

A DC-DC switching power converter is often used in electronic systems or devices for converting an unregulated input DC voltage into a regulated output DC voltage. The unregulated input voltage may have many forms including, for example, a battery having a range of voltage levels depending upon charge level and operation dynamics. The regulated output voltage may be used for a variety of purposes including providing source voltage to electronic circuitry and the like.

The DC-DC power converter may be configured as a step-down or buck converter when the output voltage is less than the lowest voltage level of the input voltage range. A buck converter may include upper and lower switching devices for controlling the voltage conversion process. The switching devices are typically implemented using N-channel devices since comparable P-channel devices are substantially larger and run significantly hotter. When using N-channel switching devices, a bootstrap or "boot" capacitor may be used to boost or increase the voltage level of control circuitry to enable the control circuitry to activate the upper switching device during power cycles. In conventional configurations, the boot capacitor generally remains charged during normal operation at medium or high load conditions. During light load conditions, however, the boot capacitor may become discharged thereby hindering or even preventing proper operation.

At least one conventional solution to maintaining charge of the boot capacitor is to use a timer or the like to force the lower switching device to turn on at a suitable rate. The timer operates independently of the converter circuitry at an independent frequency to maintain at least a minimum charge on the boot capacitor to prevent the converter from latching into an off state and shutting down. The timer, however, provides an additional unwanted load on the output since the energy required to provide the switching pulse can be significant. Also, the timer tends to interfere with switching during normal operation which disturbs the control loop. In addition, the running current of the oscillator used by the timer may be significant thereby reducing overall efficiency of the converter. In many applications, such as, for example, an automotive application, reduced efficiency of the power circuitry during standby mode may significantly drain the battery over time.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A system and method of maintaining charge on boot capacitor as described herein turns on the lower switch for a short period of time in response to a pulse control signal transitioning to initiate a power cycle. The short period of time is only long enough to ensure that the boot capacitor is sufficiently charged and does not significantly interfere with normal switching operation. In this manner, a considerable amount of power can be saved by providing a short boot capacitor refresh pulse at the beginning of each power cycle needed to maintain the output voltage. A converter configured according to a system and method as described herein does not need to maintain the voltage across the boot capacitor during low load conditions thereby conserving a significant amount of power as compared to a converter using conventional methods. Instead, when the pulse control signal finally transitions, pulse circuitry momentarily pulses on and off the lower switch to charge the boot capacitor before turning on the upper switch in response to transitioning of the pulse control signal. Thus, the boot capacitor is charged only when needed. In one embodiment, the pulse circuitry may be disabled when the load is above a predetermined load threshold since the boot capacitor remains charged during higher load conditions.

In this manner, an independently operated timer with an oscillator is not needed for maintaining charge on the boot capacitor. Instead, relatively simple pulse circuitry is added to pulse the lower switch on and off at the beginning of a pulse cycle while suppressing activation of the upper switch. The pulse circuitry can be a simple passive timer that is triggered by the pulse control signal transitioning to begin a power cycle. No complex latching circuitry is needed since the primary condition that initiates the power cycle, namely, output voltage droop, is enhanced by the action of momentarily turning on the lower switch. Also, a voltage monitor is not required on the boot supply since the boot capacitor is charged up prior to any turn on pulse. Although the pulse circuitry slightly delays activation of the upper switch of the power cycle, the amount of capacitance needed to hold up the output for the initial pulse is negligible under low load conditions.

Figure 1:
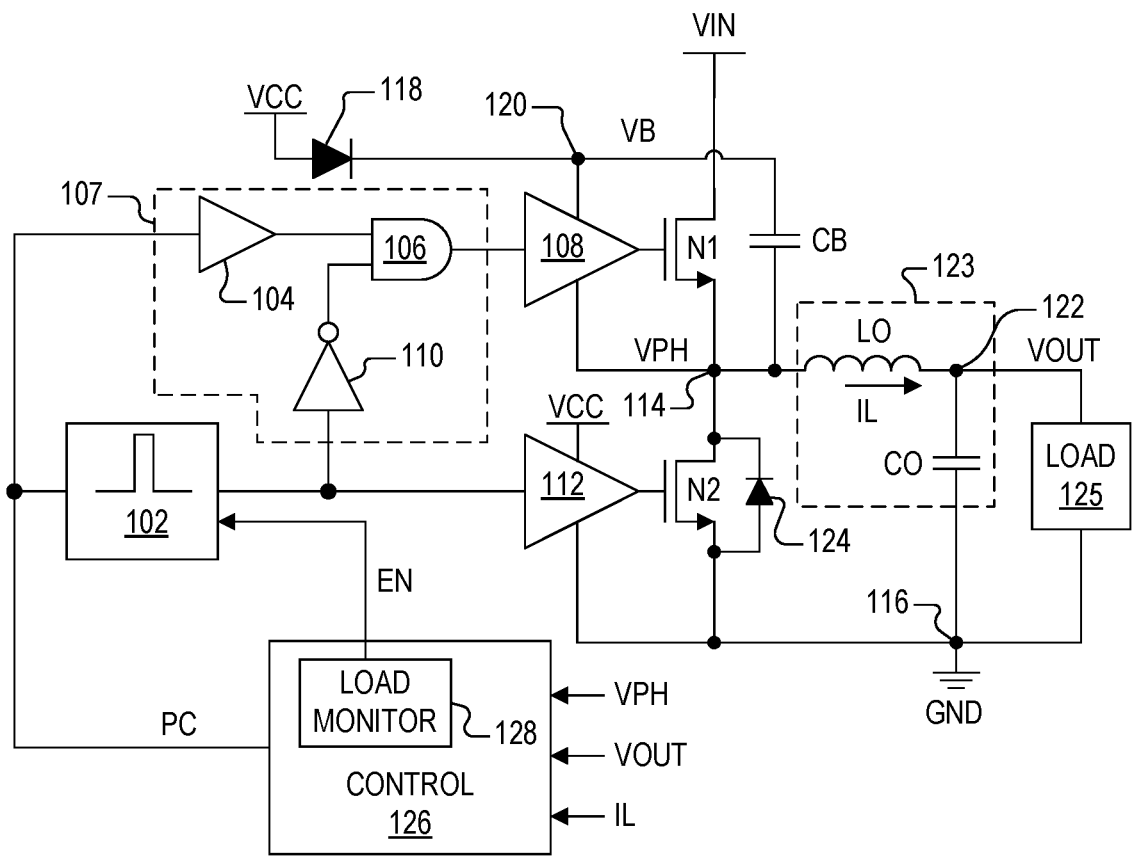
FIG. 1 is a simplified schematic and block diagram of a switching power converter implemented according to one embodiment.

FIG. 1 is a simplified schematic and block diagram of a switching power converter 100 implemented according to one embodiment. A pulse control (PC) signal is provided to the input of pulse circuitry 102 and to the input of a buffer 104, having its output coupled to one input of a 2-input Boolean logic AND gate 106. The output of the AND gate 106 is provided to an input of an upper gate driver 108. The output of the pulse circuitry 102 is provided to an input of an inverter 110 and to an input of a lower gate driver 112. The output of the inverter 110 is provided to the other input of the AND gate 106. The buffer 104, the AND gate 106 and the inverter 110 collectively form gate circuitry 107. An input voltage VIN is provided to a first current terminal of an N-channel switch N1, having a second current terminal coupled to a phase node 114 developing a phase voltage VPH. The phase node 114 is further coupled to a first current terminal of another N-channel switch N2, having a second current terminal coupled to a reference node, such as ground (GND). The output of the gate driver 108 is coupled to a control terminal of N1 and the output of the inverting gate driver 112 is coupled to the control terminal of N2.

A rectifier 118 is coupled between a supply voltage VCC and a boot node 120 developing a boot voltage VB. The rectifier 118 is shown implemented as a diode having its anode receiving VCC and its cathode coupled to the boot node 120. It is appreciated that the rectifier may be implemented using alternative methods or devices. The upper gate driver 108 has a voltage supply terminal coupled to the boot node 120 and has a supply reference terminal coupled to the phase node 114. A boot capacitor CB is also coupled between nodes 120 and 114. The lower driver 112 also has upper and lower supply voltage terminals coupled to VCC and GND, respectively. An output inductor LO is coupled between the phase node 114 and an output node 122 developing a regulated output voltage VOUT, and an output filter capacitor CO is coupled between the output node 122 and GND. The output inductor LO and the output capacitor CO collectively form output circuitry 123. A load 125 is coupled between the output node 122 and GND. N2 has an inherent diode 124 having its anode coupled to GND and its cathode coupled to the phase node 114.

Control circuitry 126 has multiple inputs for detecting operating conditions of the switching power converter 100 and an output developing the PC signal. As shown, for example, the control circuitry 126 receives the output voltage VOUT, the phase voltage VPH, and an inductor current IL flowing from the phase node 114 to the output node 122. The control circuitry 126 may include additional inputs or alternative inputs for monitoring the operating conditions of the switching power converter 100 for developing the PC signal.

The pulse circuitry 102 operates similar to a one-shot device to generate a narrow pulse at its output when the PC signal transitions from an inactive state (e.g., logic low) to an active state (e.g., logic high). The output of the pulse circuitry 102 is normally low, and when PC transitions from the inactive state to the active state, the output of the pulse circuitry 102 generates a single boot refresh pulse at its output from low to high and then back low again. The buffer 104 has a delay that is at least as long as a delay of the inverter 110 to ensure that the boot refresh pulse at the output of the pulse circuitry 102 reaches the AND gate 104 at or before the inactive-to-active (or low-to-high) transition of the PC signal. Each of the switches N1 and N2 may be implemented as an N-channel transistor device such as field-effect transistor (FET) or a metal-oxide semiconductor (MOS) FET (MOSFET) or the like. In one embodiment, N1 has a drain terminal as a first current terminal receiving VIN, a gate terminal as a control terminal coupled to the output of the driver 108, and a source terminal as a second current terminal coupled to the phase node 114. In similar manner, N2 has a drain terminal coupled to the phase node 114, a gate terminal coupled to the output of the inverting driver 112, and a source terminal coupled to ground.

In operation of the switching power converter 100, the control circuitry 126 asserts PC to its active state to initiate a power cycle. Momentarily ignoring the pulse circuitry 102, when PC is asserted, it causes the driver 108 to assert its output high to turn on N1 while N2 is off. When N1 is turned on, VIN is applied to the phase node 114 causing current IL to flow through the inductor LO to charge the output capacitor CO to maintain the output voltage VOUT across the load 125. When the control circuitry 126 detects the appropriate conditions to terminate the power cycle, such as VOUT reaching a high voltage level, the control circuitry 126 de-asserts PC back to its inactive state to turn off N1. The current IL through the inductor LO continues flowing and the voltage level of VPH drops below 0 Volts (V) turning on the diode 124. Although not explicitly shown, the control circuitry 126 may separately control N2. For example, the control circuitry 126 may turn N2 on for at least a portion of the remaining time of the cycle after N1 is turned off and before N1 is turned back on. For example, in one embodiment N2 is turned on after N1 is turned off, and N2 remains on until a zero crossover point, such as when VPH rises above 0V or when the inductor current IL goes to zero and starts to reverse.

In order for the driver 108 to turn on N1 to initiate the power cycle, the boot capacitor CB must be charged to at least a predetermined minimum voltage level to provide sufficient supply voltage for the driver 108 to turn on N1. The control circuitry 126 monitors various parameters of switching power converter 100, such as VPH, VOUT, IL, etc., to develop the PC signal used for controlling switching and the voltage conversion process. During medium to high level load conditions, the PC signal may be operated as a pulse-width modulation (PWM) signal having a duty cycle that varies depending upon load conditions and other factors. PWM operation provides greater efficiency during higher load conditions and the boot capacitor CB remains sufficiently charged. During light load conditions, however, the PC signal may be operated as a pulse-frequency modulation (PFM) signal having a generally fixed duty cycle and a variable frequency depending upon load conditions. PFM operation is more efficient during light load conditions with potentially long tristate conditions. During PFM mode of operation, the boot capacitor CB can otherwise become discharged which may otherwise disable the driver 108 from being able to turn N1 on when PC transitions to the active state.

The pulse circuitry 102 and the gate circuitry 107 are added to ensure that the boot capacitor CB is charged at the beginning of each charge cycle. When the PC signal is first asserted, the pulse circuitry 102 generates a narrow boot refresh pulse at its output so that the inverter 110 pulls one of the inputs of the AND gate 106 low to keep the output of the AND gate 106 low for the duration of the narrow boot refresh pulse. In this manner, the gate circuitry 107 initially blocks the PC signal from activating the driver 108 so that N1 is not immediately turned on. Instead, the narrow boot refresh pulse activates the lower driver 112 to turn N2 on for the duration of the boot refresh pulse. When N2 is turned on while N1 is temporarily held off, the voltage of the phase node 114 is pulled low to GND so that the lower end of the boot capacitor CB is pulled low to GND. The rectifier 118 is forward biased to apply the voltage VCC to the upper end of the boot capacitor CB at the boot node 120 so that CB is charged to about the voltage level of VCC. Upon completion of the boot refresh pulse, N2 is turned off and the voltage level of VPH and VB both rise in which the voltage of VB is greater than VPH by about VCC. This voltage level provides sufficient charge on the boot capacitor CB to enable the driver 108 to turn N1 on. Also, upon completion of the boot refresh pulse, the output of the AND gate 106 goes high activating the driver 108 to turn N1 on to initiate the power cycle. The charged boot capacitor CB ensures that the driver 108 has sufficient voltage to turn N1 on.

In this manner, when the pulse circuitry 102 is enabled, it asserts a boot refresh pulse that precedes each power pulse on the PC signal with sufficient time to ensure that the boot capacitor CB is charged. The pulse circuitry 102 may be implemented as a simple one-shot passive timer that is triggered by the power control pulse of the PC signal. No complex latching is needed since the condition that causes the power pulse on PC, such as droop of VOUT, is suspended by momentarily turning N2 on. The power pulse is delayed only by the very short duration of the boot charge pulse. Since the boot refresh pulse is only needed during low load conditions, the amount of capacitance required to hold up the output for the additional time is small. The use of the pulse circuitry 102 allows the boot capacitor CB to remain discharged during normal load conditions for additional power savings.

The duration of the boot charge pulse is minimal and has a duration that is only sufficiently long to ensure that the boot capacitor CB is charged under expected circuit conditions. In addition, the duration of the boot charge pulse is negligible compared to the operating frequency of the PC signal and does not impede normal operation conditions. The duration of the boot charge pulse can be determined based on the operating frequency range of the PC signal. In one embodiment, the PC signal may range up to about 500 kilohertz (KHz) in which the duration of the boot charge pulse is about 200 nanoseconds (ns).

In one embodiment, the control circuitry 126 may include a load monitor 128 that monitors the load 125 and that provides an enable signal EN to the pulse circuitry 102. The load monitor 128 enables the pulse circuitry 102 only during low load conditions but otherwise disables the pulse circuitry 102 to suppress the boot refresh pulse during higher load conditions. In one embodiment, the load monitor 128 may monitor load current or the other parameters to determine when the load level is below or above a predetermined load threshold for enabling or disabling the pulse circuitry 102. In this manner, the boot charge pulse may be suppressed under higher load conditions during PWM operation when the boot capacitor remains charged during normal operation. The boot charge pulse is only enabled by the load monitor 128 during low load conditions when the charge on the boot capacitor CB may otherwise fall below a minimum charge level needed for turning on N1.

Figure 2:
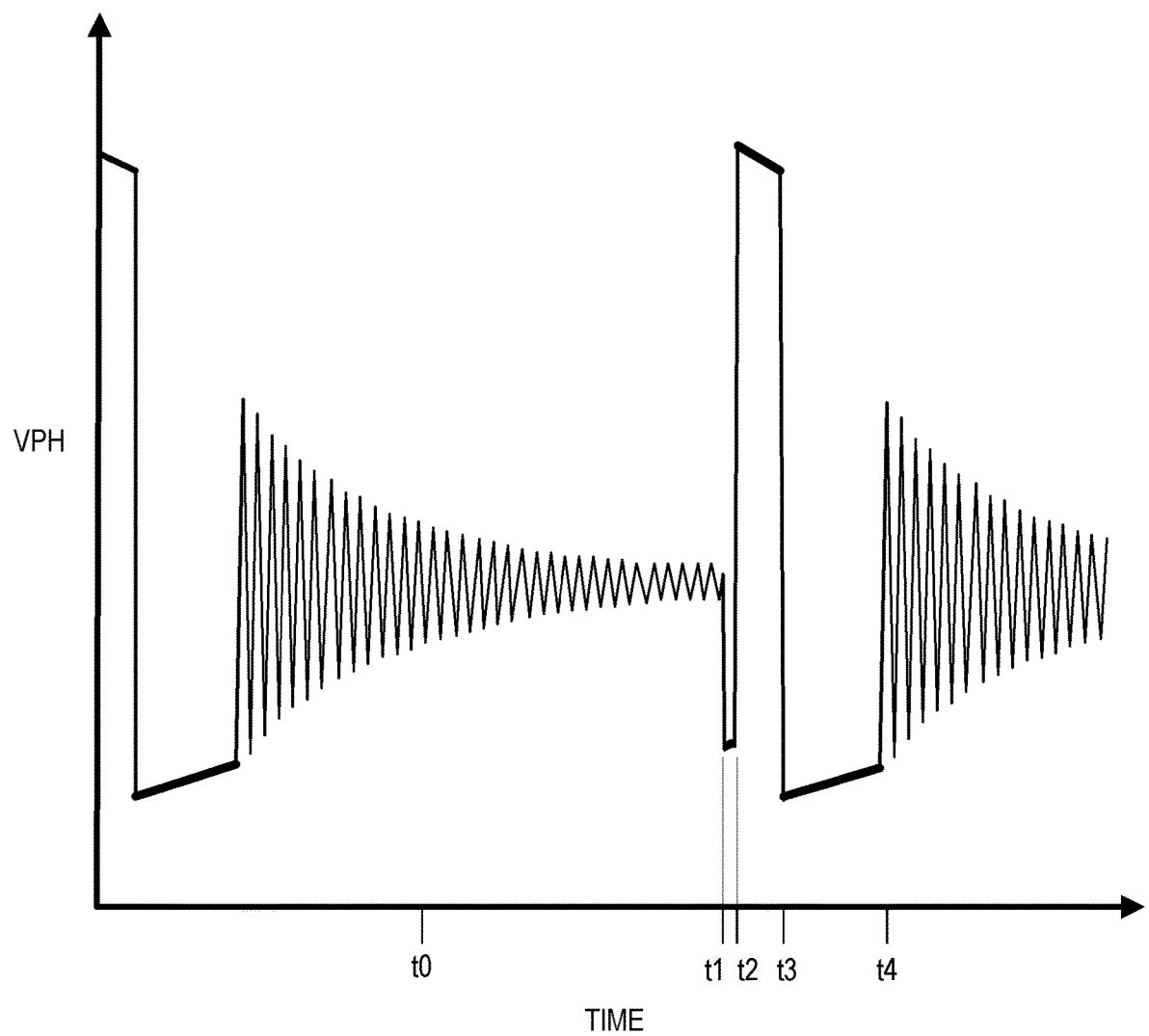
FIG. 2 is a timing diagram plotting the phase voltage of the switching power converter of FIG. 1 versus time illustrating assertion of a boot refresh pulse at the beginning of a power cycle according to one embodiment.

FIG. 2 is a timing diagram plotting the phase voltage VPH versus time illustrating assertion of a boot refresh pulse at the beginning of a power cycle according to one embodiment. At an preliminary time t0, the voltage of the VPH node is oscillating or ringing from the prior switching cycle. It is noted that such ringing does not draw significant current or power and does not substantially impact the output voltage VOUT so that overall efficiency is not compromised. The amplitude of ringing decreases over time until reaching a steady-state voltage or until the beginning of the next cycle. At a subsequent time t1, the PC signal transitions to its active state (e.g., goes high) to begin the next power cycle so that the pulse circuitry 102 initiates the narrow boot reset pulse. N2 is turned on during the boot reset pulse pulling the voltage of VPH to 0V. At the end of the boot refresh pulse at a subsequent time t2, N2 is turned off and N1 is turned on so that VPH jumps up to about the voltage level of VIN. As current increases through N1 and the output inductor LO, the voltage level of VPH decreases somewhat until N1 is turned off at subsequent time t3. At time t3 after N1 is turned off, N2 is turned on the voltage level of VPH drops below 0V and then ramps upwards towards 0V. At the zero crossover point at about time t4, such as when IL stops and begins to reverse or when VPH rises to about 0V, N2 is turned off and VPH oscillates again after time t4.

As shown in FIG. 2, the duration of the boot refresh pulse between times t1 and t2 is very narrow relative to the duration of each cycle. The boot refresh pulse, therefore, has negligible impact on voltage conversion operation of the switching power converter 100. The boot refresh pulse, however, forces N2 to turn on for a short period of time at the beginning of the power cycle to sufficiently charge CB to ensure that the driver 108 is able to activate N1 after N2 is turned off. The load monitor 128 may be provided to enable the pulse circuitry 102 to assert the boot refresh pulse only during low load conditions. In this manner, when the frequency of transitions of the pulse control signal PC is substantially reduced, the boot capacitor CB may be allowed to discharge for longer periods of time until PC is asserted. Allowing CB to discharge provides greater power savings. At higher load conditions, the load monitor 128 may disable the pulse circuitry 102 since the boot capacitor CB remains sufficiently charged during normal load conditions.

Figure 3:
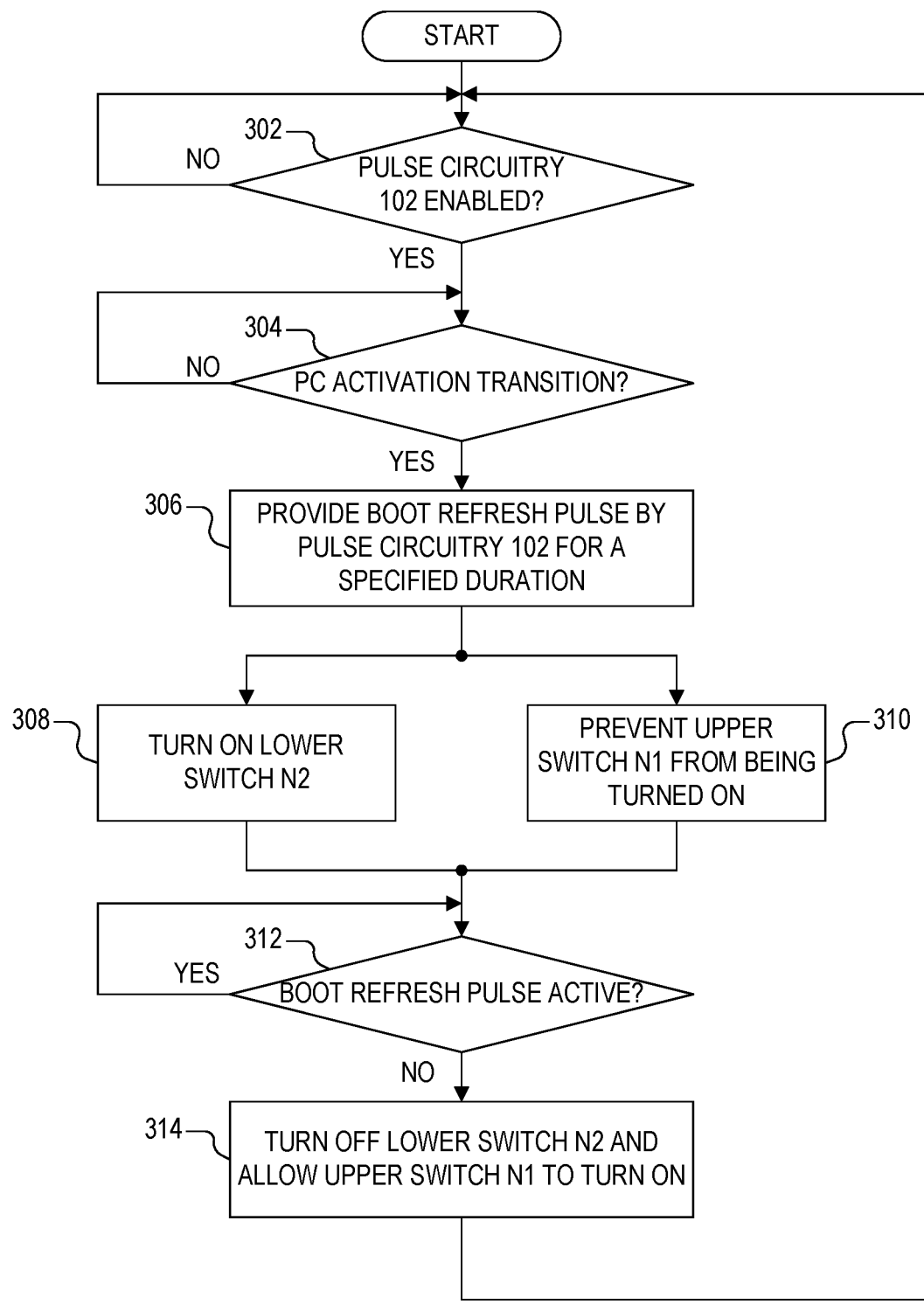
FIG. 3 is a flowchart diagram illustrating operation of the switching power converter of FIG. 1 including the pulse circuitry and the gate circuitry for charging the boot capacitor CB according to one embodiment.

FIG. 3 is a flowchart diagram illustrating operation of the switching power converter 100 including the pulse circuitry 102 and the gate circuitry 107 for charging the boot capacitor CB according to one embodiment. Operation begins while the switching power converter 100 is powered on and operating to regulated VOUT to a predetermined output voltage level. At a first block 302, it is queried whether the pulse circuitry 102 is enabled. As previously described, the control circuitry 126 may include a load monitor 128 that monitors the load 125 and that provides an enable signal EN to the pulse circuitry 102. Alternatively, the pulse circuitry 102 may remain enabled regardless of load level. If the pulse circuitry 102 is not enabled, operation loops at block 302.

When the pulse circuitry 102 is enabled, operation advances to block 304 in which the PC signal is monitored to determine an activation transition for initiating a power cycle, such as when PC transitions from an inactive state to an active state. The PC signal transitions to begin a PWM or PFM pulse to start another power cycle. While the PC signal remains inactive, operation loops at block 304. When the PC signal transitions from inactive to active, operation advances to block 306 in which the pulse circuitry 102 provides a boot refresh pulse for a specified duration. Operation advances to both blocks 308 and 310 in parallel in which the lower switch N2 is turned on and the upper switch N1 is prevented from being turned on. As previously described, the boot refresh pulse activates the lower gate driver 112 to turn on N1 and the gate circuitry 107 blocks PC from activating the upper gate driver 108 from turning on the upper switch N1. The specified duration of the boot refresh pulse may be empirically determined for a given configuration. In one embodiment, for example, the specified duration may be minimized yet sufficient to charge the boot capacitor CB to a predetermined voltage level which is sufficient for the upper gate driver 108 to turn on the upper switch N1.

Operation advances to block 312 to represent monitoring the boot refresh pulse while active. Operation loops at block 312 for the specified duration. When the boot refresh pulse is no longer active, operation advances to block 314 in which the lower switch N2 is turned off and the upper switch N1 is allowed to turn on. As previously described, N2 is turned back off and the gate circuitry 107 passes the PC signal to turn N1 on upon termination of the boot refresh pulse. Operation then loops back to block 302 for the next operation cycle.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A boot charge circuit for charging a boot capacitor of a switching power converter, the switching power converter having an upper switch with current terminals coupled between an input voltage node and a phase node and a control terminal coupled to an upper driver, having a lower switch with current terminals coupled between the phase node and a reference node, and having control circuitry providing a pulse control signal for controlling switching of the upper switch, wherein the boot capacitor is coupled in parallel with supply terminals of the upper driver between a boot node and the phase node, the boot charge circuit comprising:
  pulse circuitry that provides a boot refresh pulse in response to the pulse control signal transitioning from an inactive state to an active state, wherein the boot refresh pulse turns the lower switch on for a duration of the boot refresh pulse; and
  gate circuitry that receives the pulse control signal and the boot refresh pulse and that prevents activation of the upper driver to turn on the upper switch until after completion of the boot refresh pulse in response to the transitioning of the pulse control signal.

2. The boot charge circuit of claim 1, wherein the boot refresh pulse has a duration that is sufficient to charge the boot capacitor at least to a predetermined minimum voltage level.

3. The boot charge circuit of claim 1, wherein the boot refresh pulse has a duration that is sufficient to charge the boot capacitor to a voltage level sufficient for the upper driver to turn on the upper switch.

4. The boot charge circuit of claim 1, further comprising a rectifier having an anode receiving a supply voltage and having a cathode coupled to the boot node which is coupled to an upper supply terminal of the upper driver and to a first end of the boot capacitor, wherein the boot capacitor has a second end coupled to the phase node.

5. The boot charge circuit of claim 4, wherein a voltage of the phase node is pulled to a lower voltage level of the reference node when the lower switch is turned on so that the rectifier is forward biased to apply the supply voltage to the boot capacitor.

6. The boot charge circuit of claim 1, wherein the gate circuitry comprises a Boolean logic AND gate having a first input receiving the pulse control signal, having a second input receiving the boot refresh pulse, and having an output coupled to an input of the upper driver.

7. The boot charge circuit of claim 1, further comprising a load monitor that disables the pulse circuitry when a load level rises above a predetermined load threshold to suppress the boot refresh pulse.

8. A switching power converter, comprising:
  an upper switch having current terminals coupled between an input voltage and a phase node and having a control terminal coupled to an output of an upper driver;
  a lower switch having current terminals coupled between the phase node and a reference node and having a control terminal coupled to an output of a lower driver;
  output circuitry coupled to the phase node and the reference node for developing an output voltage;
  a boot capacitor coupled between the phase node and a boot node which is further coupled to a rectified supply voltage;
  control circuitry that receives at least one operating parameter of the switching power converter and that provides a pulse control signal to turn on the upper switch for regulating the output voltage;
  pulse circuitry that provides a boot refresh pulse in response to the pulse control signal transitioning from an inactive state to an active state, wherein the boot refresh pulse activates the lower driver to turn on the lower switch for a duration of the boot refresh pulse; and
  gate circuitry that receives the pulse control signal and the boot refresh pulse and that prevents activation of the upper driver to turn on the upper switch until after completion of the boot refresh pulse in response to the transitioning of the pulse control signal.

9. The switching power converter of claim 8, wherein the boot refresh pulse has a duration that is sufficient to charge the boot capacitor at least to a predetermined minimum voltage level.

10. The switching power converter of claim 8, wherein the boot refresh pulse has a duration that is sufficient to charge the boot capacitor to a voltage level sufficient for the upper driver to turn on the upper switch.

11. The switching power converter of claim 8, further comprising a rectifier having an anode receiving a supply voltage and having a cathode coupled to the boot node, wherein the upper driver switch has an upper supply terminal coupled to the boot node and a lower supply terminal coupled to the phase node.

12. The switching power converter of claim 11, wherein a voltage of the phase node is pulled to a lower voltage level of the reference node when the lower switch is turned on so that the rectifier is forward biased to apply the supply voltage to the boot capacitor.

13. The switching power converter of claim 8, wherein the gate circuitry comprises a Boolean logic AND gate having a first input receiving the pulse control signal, having a second input receiving the boot refresh pulse, and having an output coupled to an input of the upper driver.

14. The switching power converter of claim 8, further comprising a load monitor that disables the pulse circuitry when a load level rises above a predetermined load threshold to suppress the boot refresh pulse.

15. A method of charging a boot capacitor of a switching power converter, the switching power converter having an upper switch with current terminals coupled between an input voltage node and a phase node and a control terminal coupled to an upper driver, having a lower switch with current terminals coupled between the phase node and a reference node, and having control circuitry providing a pulse control signal for controlling switching of the upper switch, wherein the boot capacitor is coupled in parallel with supply terminals of the upper driver between a boot node and the phase node, the method comprising:
- providing a boot refresh pulse for a specified duration in response to the pulse control signal transitioning from an inactive state to an active state;
- turning on the lower switch in response to the boot refresh pulse for the specified duration of the boot refresh pulse;
- preventing the upper switch from being turned on for the specified duration of the boot refresh pulse; and
- turning off the lower switch and allowing the upper switch to be turned on upon termination of the boot refresh pulse.

16. The method of claim 15, wherein the providing a boot refresh pulse comprises providing the boot refresh pulse for the specified duration that is sufficient to charge the boot capacitor at least to a predetermined minimum voltage level.

17. The method of claim 15, wherein the providing a boot refresh pulse comprises providing the boot refresh pulse for the specified duration that is sufficient to charge the boot capacitor to a voltage level sufficient for the upper driver to turn on the upper switch.

18. The method of claim 15, further comprising:
- pulling a voltage of the phase node to a lower voltage level of the reference node when the lower switch is turned on; and
- applying a rectified supply voltage to the boot capacitor when the lower switch is turned on.

19. The method of claim 15, wherein the preventing the upper switch from being turned on comprises logically blocking the pulse control signal for a duration of the boot refresh pulse.

20. The method of claim 15, further comprising:
- monitoring a load level switching power converter; and
- disabling the pulse circuitry when the load level rises above a predetermined load threshold to suppress the boot refresh pulse.

* * * * *